US012727217B2

(12) United States Patent
Kim et al.

(10) Patent No.: US 12,727,217 B2
(45) Date of Patent: Sep. 1, 2026

(54) SEMICONDUCTOR DEVICE INCLUDING TRENCH WITH UNDERCUT STRUCTURE AND METHOD FOR MANUFACTURING THE SAME

(71) Applicant: KOREA INSTITUTE OF SCIENCE AND TECHNOLOGY, Seoul (KR)

(72) Inventors: Hyung-Jun Kim, Seoul (KR); Seunghwan Kim, Seoul (KR); Daeyoon Baek, Seoul (KR)

(73) Assignee: Korea Institute of Science and Technology, Seoul (KR)

( * ) Notice: Subject to any disclaimer, the term of this patent is extended or adjusted under 35 U.S.C. 154(b) by 900 days.

(21) Appl. No.: 17/972,912

(22) Filed: Oct. 25, 2022

(65) Prior Publication Data

US 2023/0142462 A1 May 11, 2023

(30) Foreign Application Priority Data

Nov. 5, 2021 (KR) ........................ 10-2021-0151468

(51) Int. Cl.

*H10D 62/17* (2025.01)
*H10D 30/01* (2025.01)
*H10D 30/62* (2025.01)
*H10D 62/40* (2025.01)

(52) U.S. Cl.

CPC ......... *H10D 62/235* (2025.01); *H10D 30/024* (2025.01); *H10D 30/6211* (2025.01); *H10D 62/405* (2025.01)

(58) Field of Classification Search

CPC ........... H10D 30/6211; H10D 30/6212; H10D 62/405; H10D 62/40; H01L 21/02609; H10P 14/3466

See application file for complete search history.

(56) References Cited

U.S. PATENT DOCUMENTS

| | | | |
|---|---|---|---|
| 9,324,818 B2 | 4/2016 | Waldron et al. | |
| 2006/0292719 A1* | 12/2006 | Lochtefeld ........ | H01L 21/02521 257/E21.127 |
| 2010/0289116 A1 | 11/2010 | Lin et al. | |

(Continued)

FOREIGN PATENT DOCUMENTS

| | | |
|---|---|---|
| JP | 3-175629 A | 7/1991 |
| JP | 2020-46496 A | 3/2020 |
| KR | 10-1999-0069739 A | 9/1999 |
| KR | 10-2008-0027254 A | 3/2008 |

(Continued)

OTHER PUBLICATIONS

Hsu, Chao-Wei, et al. "Nano epitaxial growth of GaAs on Si (001)." Applied Physics Letters 99.13 (2011): 133115, (4 pages in English).

(Continued)

*Primary Examiner* — Britt Hanley
*Assistant Examiner* — Jason James Greaving
(74) *Attorney, Agent, or Firm* — NSIP Law

(57) ABSTRACT

Embodiments relate to a semiconductor device including a trench with undercut structure including a substrate made of a first material; an insulation layer formed on an upper surface of the substrate; at least one trench penetrating the insulation layer toward the substrate; and at least one seed layer formed in the trench, the seed layer made of a second material which is different from the first material, and a method for manufacturing the same.

16 Claims, 11 Drawing Sheets

(56) References Cited

U.S. PATENT DOCUMENTS

| | | | |
|---|---|---|---|
| 2012/0261828 A1 | 10/2012 | Bruce et al. | |
| 2016/0027777 A1 | 1/2016 | Eneman et al. | |
| 2016/0181099 A1* | 6/2016 | Mukherjee | H10D 84/853 257/190 |
| 2018/0151703 A1 | 5/2018 | Lin et al. | |
| 2020/0090926 A1 | 3/2020 | Morita et al. | |

FOREIGN PATENT DOCUMENTS

| | | |
|---|---|---|
| KR | 10-2009-0053033 A | 5/2009 |
| KR | 10-2015-0037408 A | 4/2015 |
| KR | 10-2015-0037508 A | 4/2015 |
| KR | 10-2015-0097540 A | 8/2015 |
| KR | 10-2016-0051732 A | 5/2016 |
| KR | 10-2019-0099385 A | 8/2019 |

OTHER PUBLICATIONS

Kim, Yoonjoong, et al. "Switchable-Memory Operation of Silicon Nanowire Transistor." *Advanced Electronic Materials* vol. 4. Issue 12 (2018): 1800429. pp. 1-7.

Imaeda, Kodai, et al. "Design and fabrication of differently shaped pyramids on Si {100} by anisotropic wet etching." *Microsystem Technologies* vol. 22. Issue 12 (2016). pp. 2801-2809.

Wang, Zhuqing, et al. "The effect of increasing interfacial strength in micro fluidic system for heat detection with micro-sandglass shaped interlocks." *Microsystem Technologies* vol. 25. Issue 2 (2019). pp. 633-640.

Thean, A. V. Y., et al. "Heterogeneous Nano-electronic Devices Enabled by Monolithic Integration of IIIV, Ge, and Si to expand future CMOS functionality." *Technical Proceedings of the 2014 NSTI Nanotechnology Conference and Expo, NSTI-Nanotech*. vol. 3. (2014). pp. 1-4.

Han, Yu, et al. "Selective lateral epitaxy of dislocation-free InP on silicon-on-insulator." *Applied Physics Letters* vol. 114. Issue 19 (2019): 192105, pp. 1-6.

Wang, Jian-Huan, et al. "Epitaxial Growth of Ordered In-Plane Si and Ge Nanowires on Si (001)." *Nanomaterials* vol. 11. Issue 3 (2021): 788. pp. 1-10.

* cited by examiner

< Existing ART >

< Trench with undercut structure >

Wet etching process time

SEMICONDUCTOR DEVICE INCLUDING TRENCH WITH UNDERCUT STRUCTURE AND METHOD FOR MANUFACTURING THE SAME

CROSS-REFERENCE TO RELATED APPLICATION

This application claims priority to Korean Patent Application No. 10-2021-0151468, filed on Nov. 5, 2021, and all the benefits accruing therefrom under 35 U.S.C. § 119, the contents of which in its entirety are herein incorporated by reference.

BACKGROUND

1. Field

Embodiments relate to a semiconductor device including a trench in which a seed layer is to be formed and a method for manufacturing the same, and more particularly, to a semiconductor device including a trench with undercut structure to minimize the density of threading dislocations propagating from a seed layer to be formed in the trench into an overlying channel layer and a method for manufacturing the same.

[Description about National Research and Development Support]

This study was supported by the technology development program respond to the Development of next-generation intelligent semiconductor technology of Ministry of Science and ICT, Republic of Korea (Project No. 1711127983) under the superintendence of National Research Foundation of Korea.

2. Description of the Related Art

Integrated circuits have various types of semiconductor devices such as transistors mounted thereon. Over the past tens of years, downscaling has contributed greatly to the growth of semiconductor industry by reducing the size of semiconductor devices to increase the integration density of the semiconductor devices.

However, downscaling has been used to reduce the size horizontally. Recently, as the size is reduced to the ultramicro scale level of less than 10 nm, it becomes increasingly difficult to further reduce the size horizontally.

By this reason, to increase the integration density, 3-dimensional (3D) vertical integration technology is attracting attention.

There are two emerging 3D integration technologies, Through Silicon Via (TSV) and Monolithic 3D (M3D) stacking.

However, the TSV process has low wiring density, high alignment difficulty or high cost and procedural complexity drawbacks.

On the other hand, the M3D process includes transferring or epitaxially growing a few hundreds of nm-sized channel layer on an underlying substrate having a device by making use of a process for forming a Silicon On Insulator (SOI) structure. In general, the transfer method uses ion implant, wafer bonding, annealing and Chemical Mechanical Polishing (CMP) processes. The epitaxy growth on the underlying layer has a large scale advantage compared to the transfer method, but due to the presence of an insulation layer between the underlying layer and the overlying layer, the growth technique with high crystalline quality is necessary. In case that it is possible to achieve the channel growth with high crystalline quality, the M3D process using epitaxy growth overcomes at least some of the drawbacks of the TSV process.

To grow the overlying highly crystalline channel layer, it is necessary to form the overlying highly crystalline channel layer on the insulation layer for insulation from the underlying device layer. However, since it is very difficult to grow the overlying highly crystalline channel layer on the amorphous interlayer insulating material, it is necessary to transfer the crystallinity and surface orientation of the underlying substrate using a seed layer connecting the overlying channel layer to the underlying substrate when growing the overlying channel layer.

However, when the seed layer is grown from a material having a different lattice constant from Si, dislocations are formed. The dislocations include misfit dislocations at the interface between the seed layer and the Si substrate and threading dislocations extending upward from the underlying substrate. When the threading dislocations extend to the overlying channel layer, the threading dislocations act as defects in the channel layer and hinder the device fabrication or degrade the device performance.

Accordingly, to grow the highly crystalline channel layer, it is necessary to minimize the density of dislocations in the seed layer that affect the quality of the overlying channel layer, such as threading dislocations propagating into the overlying channel layer.

To reduce the density of dislocations in the seed layer that affect the quality of the overlying channel layer, in some cases, the Aspect Ratio Trapping (ART) technique is used. However, ART fails to sufficiently reduce the dislocation density unless the aspect ratio is sufficiently high. In ART, to form a trench structure having a sufficiently high aspect ratio to improve the quality of the overlying channel layer, the procedural complexity increases.

RELATED LITERATURES

Patent Literature (Patent Literature 1) Korean Patent Publication No. 10-2015-0037408 (2015.04.08.)

SUMMARY

According to the embodiments of the present disclosure, there is provided a semiconductor device including a trench with undercut structure for reducing the density of all dislocations in four directions at a relatively low aspect ratio and low procedural complexity and a method for manufacturing the same.

A semiconductor device according to an aspect of the present disclosure includes a substrate made of a first material; an insulation layer formed on an upper surface of the substrate, the insulation layer made of an insulating material; at least one trench penetrating the insulation layer toward the substrate; and at least one heterolayer formed in at least part of an internal space of the trench, the heterolayer made of a second material which is different from the first material. The insulation layer is configured to form the trench with undercut structure in which a width of a top or a narrowest width between the top and a bottom is narrower than a width of the bottom in cross section of the trench.

In an embodiment, the second material may have a lattice mismatch with respect to the first material, and the heterolayer may include first and second threading dislocations extending, at least in part, in a first direction and a second direction, respectively, non-parallel to the upper surface of the substrate and parallel to a <110> direction of a (111) surface, and propagation of at least some of the first and second threading dislocations may be terminated by sidewalls which surround an inside of the trench.

In an embodiment, the sidewalls of the trench with undercut structure may be configured such that an area of an upper surface of the heterolayer is smaller than that of vertical sidewalls.

In an embodiment, the trench with undercut structure may be configured such that an imaginary diagonal line from a bottom point on a side to a top point on an opposite side in cross section of the trench has an angle which is equal to or higher than a threshold angle. The threshold angle is an intersection angle indicating a highest propagation angle among propagation angles of threading dislocations which may be generated in the heterolayer from a surface of the substrate in cross section of the trench, and is based on a value of the lattice mismatch between the second material and the first material.

In an embodiment, the trench with undercut structure may be configured such that an imaginary diagonal line from a bottom point on a side to a top point on an opposite side in cross section of the trench has an intersection angle of 60° or more and less than 90°.

In an embodiment, the trench with undercut structure may be configured such that at least one of the two sidewalls in cross section is non-vertical. The sidewall includes a linear or non-linear sidewall.

In an embodiment, when the substrate is made of a material selected from a first group, the heterolayer may be made of a material selected from a second group. When the substrate is made of a material selected from the second group, the heterolayer may be made of a material selected from the first group. The first group includes Si, Group IV material other than Si and a combination thereof. The second group includes at least one of $Si_xGe_{1-x}$, Ge, Group III-V, Group II-VI, a material which can be grown by heterogeneous junction or a combination thereof.

The trench with undercut structure according to the above-described embodiments may be extended from a side of the substrate to an opposite side and the heterolayer in the trench may be continuously formed.

The semiconductor device according to the above-described embodiments may include a plurality of the trenches and a plurality of the heterolayers, each heterolayer formed in each trench. The plurality of trenches is arranged side by side in a direction, and the plurality of trenches is arranged spaced apart from each other to avoid overlap in an area of each corresponding heterolayer formed in each trench.

The semiconductor device according to the above-described embodiments may be a semiconductor device with Monolithic 3-Dimensional (M3D) structure. The heterolayer is a seed layer for growing an overlying channel layer.

The semiconductor device according to the above-described embodiments may be a semiconductor device with FINFET structure. The heterolayer is a FIN body layer disposed below an overlying gate to form a channel.

A method for manufacturing a semiconductor device according to another aspect of the present disclosure includes forming a mask layer on a substrate made of a first material; patterning the mask layer to form a mask pattern; forming an insulation layer on other exposed surface of the substrate having the mask pattern; removing the mask pattern from a structure of the mask pattern and the insulation layer on the substrate to form a trench; and forming a heterolayer made of a second material in the trench. The mask pattern has a cross section configured to form the trench with undercut structure in which a width of a top or a narrowest width between the top and a bottom is narrower than a width of the bottom in cross section of the trench formed by the insulation layer.

In an embodiment, the mask pattern may be formed as a first mask pattern having a cross section configured such that a width of a region having a narrowest distance between sides in cross section of the pattern is narrower than the width of the top and the width of the bottom. The cross section of the first mask pattern includes a linear or non-linear side.

In an embodiment, the mask pattern may be formed as a second mask pattern having a cross section configured such that the width of the top is narrower than the width of the bottom in cross section of the pattern. The cross section of the second mask pattern includes a linear or non-linear side.

In the above-described embodiment, the insulation layer may be formed with a smaller thickness than a cross-sectional height of the first mask pattern or the second mask pattern from the substrate.

In an embodiment, the mask layer may be made of a third material which is different from the first material and the second material.

In an embodiment, the third material may be a material selected from a third group consisting of Group IV, Group III-V and Group II-VI semiconductor materials, MgO and a combination thereof.

In an embodiment, the step of forming the mask pattern may include forming a line pattern extended in a direction.

In an embodiment, the step of forming the mask pattern may include forming a plurality of isolation patterns arranged side by side in a direction.

In an embodiment, a value of a width of a narrowest region between sidewalls in cross section of the mask pattern may be determined based on a process time of an etching process.

In an embodiment, the insulation layer may be formed with a thickness of 90 nm to 110 nm.

In an embodiment, the bottom of the mask pattern may be formed with a width of 55 nm to 65 nm.

The semiconductor device according to an aspect of the present disclosure includes the trench in the insulation layer, the trench having an undercut-shaped cross-sectional structure in which the top width or the narrowest width between top and bottom is narrower than the bottom width. When the heterolayer made of a different material from the substrate is formed in the trench, the characteristics of the undercut structure relatively suppress the propagation of threading dislocations of the first direction and threading dislocations of the second direction parallel to the <110> direction of the (111) surface from the heterolayer on the surface of the substrate into the overlying layer on the heterolayer.

The semiconductor device with the trench structure has a wide range of 3-dimensional (3D) semiconductor device applications.

In case that the semiconductor device is a transistor device with Monolithic 3D (M3D) structure, the heterolayer of the semiconductor device is a seed layer for forming the overlying channel layer. It is possible to manufacture the M3D device having the overlying channel layer with higher quality by reducing the density of dislocations in the seed layer due to the characteristics of the undercut structure. In particular, there is no need to form a buffer layer between the substrate and the seed layer to reduce the dislocation density, thereby further reducing the complexity and cost of the process of manufacturing the M3D device.

Additionally, in case that the semiconductor device is a transistor device with FINFET structure, the heterolayer of the semiconductor device is a FIN body layer. It is possible to form the FIN body layer with higher quality by reducing the density of dislocations in the FIN body layer due to the characteristics of the undercut structure. In particular, compared with the existing process of directly growing the FIN body layer through patterning, it is possible to adjust Aspect Ratio Trapping (ART) of the FIN body layer more easily by a more straightforward process of adjusting the thickness of the insulation layer.

The effects of the present disclosure are not limited to the above-mentioned effects, and other effects not mentioned herein will be clearly understood by those skilled in the art from the appended claims.

BRIEF DESCRIPTION OF THE DRAWINGS

The following is a brief introduction to necessary drawings in the description of the embodiments to describe the technical solutions of the embodiments of the present disclosure or the existing technology more clearly. To identify similar elements shown in one or more drawings, the same reference number is used. It should be understood that the accompanying drawings are for the purpose of describing the embodiments of the present disclosure and are not intended to be limiting of the present disclosure. Additionally, various modifications such as exaggeration and omission may be applied to some elements shown in the accompanying drawings for clarity of description.

DETAILED DESCRIPTION

Figure 1:
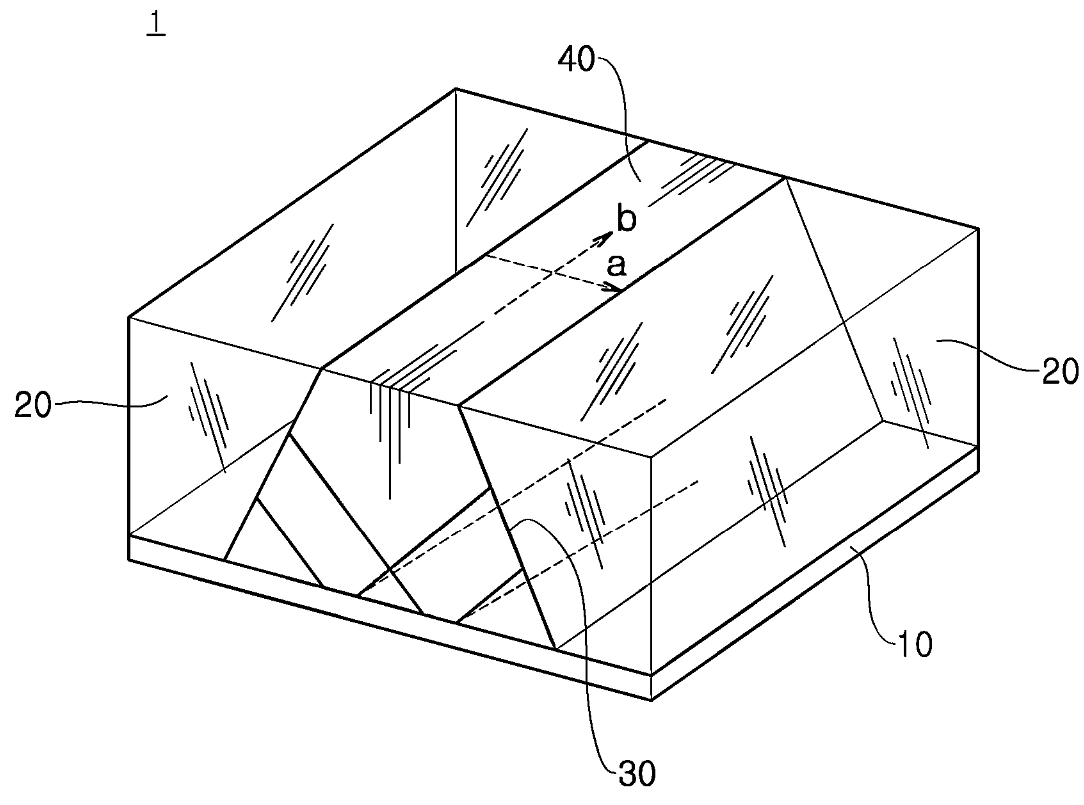
FIG. 1 is a transparent perspective view of a semiconductor device including a trench with undercut structure.

The terms indicating relative spaces such as "below", "on" and the like may be used to describe a relationship of an element to another element shown in the drawing more easily. These terms are intended to include not only the intended meanings in the drawings but also other meanings or operations of a device used. For example, when the device in the drawing is reversed, elements described as being "below" other elements are described as being "on" the other elements. Accordingly, the exemplary term "below" includes both up and down directions. The device may rotate at 90° or different angles, and the terms indicating relative spaces are interpreted accordingly.

When an element is referred to as being "on" another element, the element may be on the other element, or intervening elements may be interposed between. In contrast, when an element is referred to as being "immediately on" another element, there is no intervening element between them.

The terms "first", "second" and the like are used to describe various portions, components, regions, layers and/or sections, but are not limited thereto. These terms are used to distinguish a portion, component, region, layer or section from another portion, component, region, layer or section. Accordingly, a first portion, component, region, layer or section described below may be referred to as a second portion, component, region, layer or section without departing from the scope of the present disclosure.

The terminology used herein is for the purpose of describing particular embodiments only and is not intended to be limiting of the present disclosure. As used herein, the singular forms include the plural forms as well, unless the context clearly indicates otherwise. The term "comprising" when used in this specification, specifies the presence of stated features, regions, integers, steps, operations, elements and/or components, but does not preclude the presence or addition of one or more other features, regions, integers, steps, operations, elements and/or components.

Hereinafter, the embodiments of the present disclosure will be described in detail with reference to the accompanying drawings. However, the present disclosure is not limited to the disclosed embodiment, and may be embodied in a variety of different forms, and these embodiments are provided so that the present disclosure will be thorough and complete, and will fully convey the scope of the present disclosure to those skilled in the art.

The embodiments of the present disclosure relate to a semiconductor device including a trench having an undercut-shaped cross-sectional structure in an insulation layer. When a heterolayer made of a second material that is different from a first material of which a substrate is made, is formed in the undercut structure of the semiconductor device, the characteristics of the undercut structure reduce the density of dislocations in the heterolayer formed in all or part of the internal space of the trench.

In the specification, the dislocation density refers to the density of dislocations that affect an overlying layer or overlying structure on the heterolayer among dislocations generated in the heterolayer.

Undercut Structure

Figure 2:
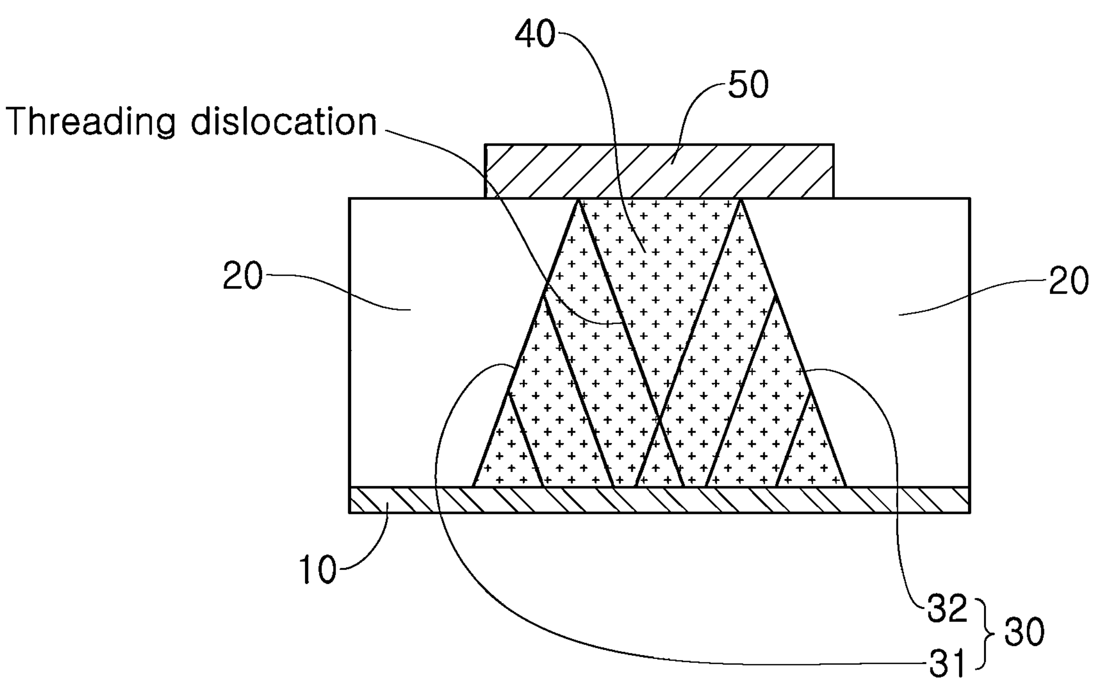
FIG. 2 is a cross-sectional view of the semiconductor device taken in (a) direction of FIG. 1.

FIGS. 1 and 2 are diagrams showing a semiconductor device 1 according to an aspect of the present disclosure.

FIG. 1 is a transparent perspective view of the semiconductor device 1 including a trench with undercut structure, and FIG. 2 is a cross-sectional view of the semiconductor device 1 taken along the (a) direction of FIG. 1.

Although a pattern is omitted from FIG. 1 as opposed to FIG. 2, it will be obvious to those skilled in the art that this omission is intended to clearly show the dislocations in FIG. 1. It will be also obvious to those skilled in the art that FIG. 1 includes the components 10, 20, 30, 40 identified by the pattern of FIG. 2 at the same position and with the same structure. The intentional omission of the pattern is the same case with FIG. 3A and FIG. 3B.

Referring to FIGS. 1 and 2, the semiconductor device 1 includes a substrate 10; an insulation layer 20; a trench 30; and a heterolayer 40. In some embodiments, the semiconductor device 1 may further include an overlying layer or overlying structure 50. The overlying layer or overlying structure 50 may be formed on all or part of the upper surface of the heterolayer 40. The overlying layer or overlying structure 50 may be also formed on part of the upper surface of the insulation layer 40 adjacent to the heterolayer 40.

The substrate 10 is a support that supports the other components 20, 40 of the semiconductor device 1.

In an embodiment, the substrate 10 may be made of a material selected from a first group consisting of Si, Group IV materials other than Si and a combination thereof.

In another embodiment, the substrate 10 may be made of a material selected from a second group consisting of $Si_xGe_{1-x}$, Ge, Group III-V, Group II-VI, other materials that can be grown by heterogeneous junction and a combination thereof.

The Group III-V compound is a compound including Group III and Group V elements in the periodic table, and for example, may be a compound such as GaP, GaAs, InAS, AlAs, InP, InSb, AlSb. The Group II-VI compound is a compound including Group II and Group VI elements in the periodic table.

The insulation layer 20 is formed on the substrate 10. The insulation layer 20 includes various types of dielectric materials. Since the insulation layer 20 is positioned in between the channel layer 50 and the substrate 10, the insulation layer 20 may be referred to as Inter Layer Dielectric (ILD).

The insulation layer 20 may be, for example, made of a material selected from the group consisting of $SiO_2$, SiNx, SiOxNy, AlN, HfOx, ZrOx, and a combination thereof. However, the material group of the insulation layer 20 is not limited thereto.

The trench 30 has an aperture shape such that at least part penetrates inward from the upper surface of the insulation layer 20 toward the substrate. In the trench 30, one end of the aperture is closed by the surface of the substrate 10.

The substrate 10 and the insulation layer 20 define the structure of the trench 30. The insulation layer 20 defines the cross-sectional structure of the trench 30. In certain embodiments, the insulation layer 20 defines the side cross-sectional structure in a direction toward the widest cross section of the trench 30. When the trench 30 is continuously or discontinuously extended in a direction of the substrate 10 (for example, (b) direction of FIG. 1), the insulation layer 20 may define the cross-sectional structure taken in a direction (for example, (a) direction of FIG. 1) perpendicular to the extension direction. The insulation layer 20 provides sidewalls 31, 32 of the trench 30.

The trench 30 exposes the sidewalls of the insulation layer 20, and when the trench 30 is filled with an arbitrary material, the trench 30 has a structure in which the corresponding material and the substrate 10 can form an interface.

The heterolayer 40 is formed in all or part of the internal space of the trench 30.

The heterolayer 40 is made of a second material that is different from the second material included in the substrate 10. The second material is a hetero material having a lattice mismatch with respect to the first material.

In an embodiment, when the first material of the substrate 10 is a material selected from the first group, the heterolayer 40 may be made of a material selected from the second group.

Alternatively, when the first material of the substrate 10 is a material selected from the second group, the heterolayer 40 may be made of a material selected from the first group. For example, when the first material of the substrate 10 is Si selected from the first group, the second material of the heterolayer 40 may be Ge or GaAs selected from the second group.

Hereinafter, for clarity of description, the present disclosure will be described in more detail based on the embodiments in which the substrate 10 is made of the first material (for example, Si) selected from the first group.

When the substrate 10 and the heterolayer 40 are made of the first material and the second material having different lattice constants, dislocations propagating from the interface between the substrate 10 and the heterolayer 40 are generated in the heterolayer 40 due to the lattice mismatch between the substrate 10 and the heterolayer 40. The dislocations include misfit dislocations or threading dislocations.

The misfit dislocations are formed at the interface between the heterolayer 40 and the substrate 10.

In contrast, the threading dislocations propagate in non-parallel to the surface of the substrate 10 from the end of the misfit dislocations. That is, the threading dislocations tend to extend in the vertical direction with respect to the surface of the substrate 10. For example, the propagation direction of the threading dislocations may have sidewall direction components which are a combination of vertical direction components and horizontal direction components with respect to the surface of the substrate 10.

The threading dislocations propagate, at least in part, in the first direction or the second direction parallel to the <110> direction of the (111) surface from the end of misfit dislocations formed in the <111> direction on the 3D structure. When the threading dislocations are projected onto the surface of the substrate 10, the threading dislocations extend in the forward direction or reverse direction of the first direction or the forward direction or reverse direction of the second direction among the [110] directions in 2D. That is, when the heterolayer 40 is projected onto the surface of the substrate 10, the heterolayer 40 includes the threading dislocations extending in four directions, up, down, left and right directions, along the [110] direction from the surface of the substrate 10.

Hereinafter, for clarity of description, in the detailed description of the present disclosure, when projected, the threading dislocations propagating along the first direction are referred to as first threading dislocations, and the threading dislocations propagating along the second direction are referred to as second threading dislocations. The first direction and the second direction are depicted as (a) direction and (b) direction in FIG. 1.

Many first and second threading dislocations are formed in the heterolayer 40, and in particular, with the increasing density of dislocations propagating into the overlying layer or overlying structure 50 through the upper surface (i.e., the upper surface of the trench 30) of the heterolayer 40, the quality of the semiconductor device decreases.

As shown in FIGS. 1 and 2, in the semiconductor device 1 of the present disclosure, the cross-sectional structure of the trench 30 has a cross-sectional shape that minimizes the density of threading dislocations in the heterolayer 40 that affect the overlying layer or overlying structure 50. In the specification, the cross-sectional shape structure is referred to as a 'undercut structure'.

The undercut structure of the trench 30 is configured such that the cross-sectional top width opposite the substrate 10 or the narrowest width between the cross-sectional top and the cross-sectional bottom has a narrower width than the cross-sectional bottom close to the substrate 10. For example, the trench 30 with undercut structure has the cross-sectional structure in which the width of the cross-sectional top is the narrowest width and is narrower than the width of the cross-sectional bottom as shown in FIGS. 1 and 2.

The trench 30 with undercut structure has the sidewalls 31, 32 that are non-perpendicular to the substrate 10 in cross section. In the trench 30 with undercut structure, the sidewalls 31, 32 do not intersect and are configured such that the top width between a top point P1 on a side and a top point P2 on an opposite side has a value of 0 or greater. As shown in FIG. 2, in the trench 30 with undercut structure, the sidewall 31 from a bottom point P3 on a side to the top point P1 on the corresponding side and the sidewall 32 from a bottom point P4 on the opposite side to the top point p2 on the corresponding side are formed as diagonal lines (or diagonal curved lines) in cross section of the trench 30, so the sidewalls 31, 32 are not perpendicular to the surface of the substrate 10.

The sidewalls 31, 32 may be formed in a linear or non-linear shape with curvature at least in part. When the sidewalls 31, 32 are all linear, the trench 30 with undercut structure may have a trapezoidal cross section as shown in FIGS. 1 and 2. Alternatively, when the sidewalls 31, 32 are all concave in a direction toward the substrate 10, the trench 30 with undercut structure may have a bell shaped-cross section.

In the semiconductor device 1, the trench 30 with undercut structure has structural characteristics that relatively reduce the density of dislocations in the heterolayer 40.

Figure 3A:
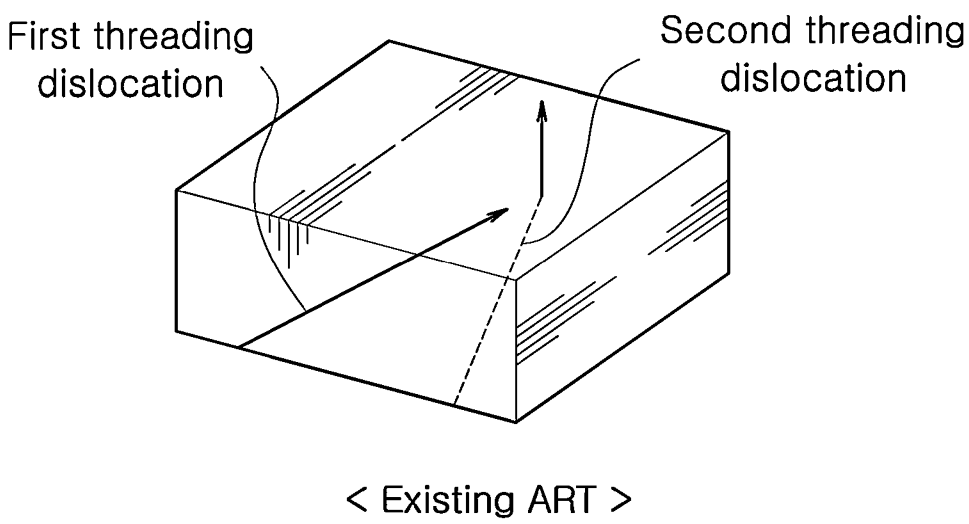
FIG. 3A and FIG. 3B are diagrams showing a comparison of the performance of reducing the threading dislocation density between a trench with undercut structure according to an embodiment of the present disclosure and a trench of Aspect Ratio Trapping (ART).
Figure 3B:
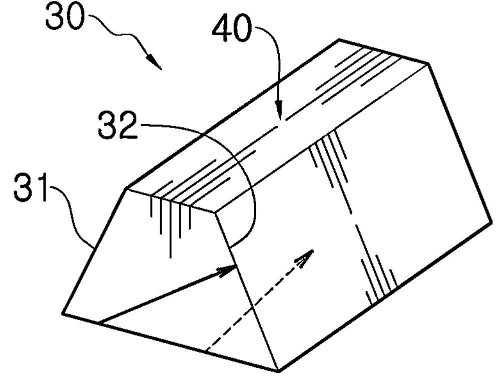

FIG. 3A and FIG. 3B are diagrams showing a comparison of the performance of reducing the density of threading dislocations between the trench 30 with undercut structure under the same value of aspect ratio according to an embodiment of the present disclosure and the trench of Aspect Ratio Trapping (ART).

Referring to FIG. 3A and FIG. 3B, under ART, the trench 30 has the sidewalls 31, 32 perpendicular to the surface of the substrate 10. The trench 30 of ART has a rectangular cross section. In ART, when the depth of the trench 30 is low (that is, when the value of aspect ratio is small), threading dislocations in the heterolayer 40 may propagate into the overlying layer or overlying structure 50.

However, in the semiconductor device 1 of the present disclosure, the trench 30 with undercut structure has the sidewalls 31, 32 that are non-perpendicular to the surface of the substrate 10.

The trench 30 with undercut structure has a relatively narrow area of the upper surface of the heterolayer 40 that contacts the overlying layer or overlying structure 50 in comparison with the trench structure of the ART technique. Thus, as shown in FIG. 3A and FIG. 3B, under the same depth of the trench 30 (i.e., the same aspect ratio), the trench 30 with undercut structure suppresses all or some of the first threading dislocations and all or some of the second threading dislocations that ART fails to suppress. That is, under the trench 30 with undercut structure, the density of threading dislocations that affect the channel layer 50 reduces.

The trench 30 with undercut structure reduces the density of some of the second threading dislocations. As a result, as opposed to ART, the trench 30 with undercut structure may suppress the propagation of some of the second threading dislocations in the heterolayer 40 that affect the overlying layer or overlying structure 50 into the overlying layer or overlying structure 50. Here, some of the second threading dislocations include second threading dislocations propagating into the remaining area excluding the projection area of the top region of the heterolayer 40 onto the substrate 10 from the projection area of the bottom region of the heterolayer 40 onto the substrate 10. The propagation of some of the second threading dislocations is quickly terminated by the non-vertical sidewall 31 or 32 in comparison with the vertical sidewall 31 or 32.

Additionally, the trench 30 with undercut structure reduces the density of at least some of the first threading dislocations. As a result, as opposed to ART, the trench 30 with undercut structure may suppress the propagation of all or some of the first threading dislocations in the heterolayer 40 that affect the overlying layer or overlying structure 50 into the overlying layer or overlying structure 50.

Figure 4:
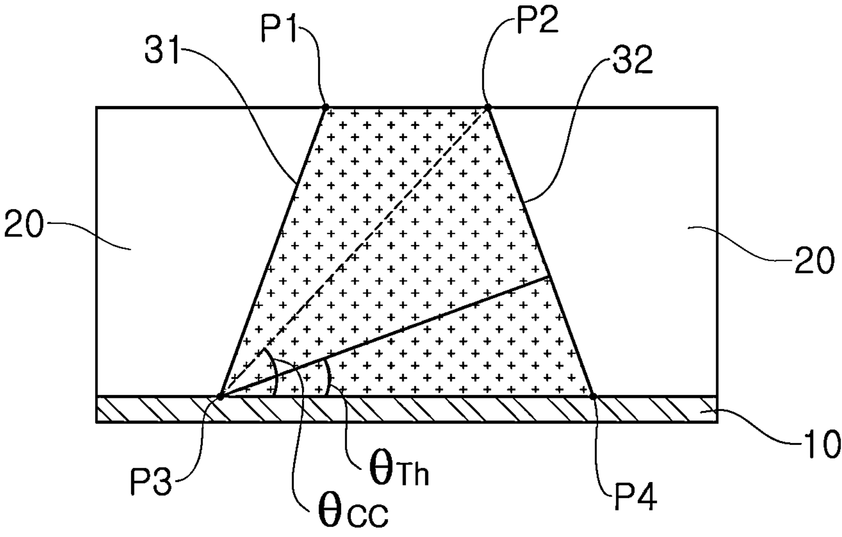
FIG. 4 is a diagram illustrating a threshold angle for reducing the density of all threading dislocations according to an embodiment of the present disclosure.

FIG. 4 is a diagram illustrating a threshold angle for reducing the density of all threading dislocations according to an embodiment of the present disclosure.

Referring to FIG. 4, the trench 30 with undercut structure may be configured to reduce the density of all threading dislocations that affect the overlying layer or overlying structure 50 in the first direction and/or the second direction among threading dislocations that may be generated in the heterolayer 40.

For clarity of description, the threshold angle is described based on embodiments for suppressing all the first threading dislocations of the first direction.

To suppress the density of all threading dislocations that affect the overlying layer or overlying structure 50, the trench 30 with undercut structure may be configured such that an imaginary diagonal line from the bottom point (for example, P2) of one sidewall (for example, 31) to the top point (for example, P3) of the other sidewall (for example, 32) in cross section has an angle that is equal to or higher than the threshold angle $\theta_{Th}$. The angle $\theta_{cc}$ of the cross-sectional diagonal line and the threshold angle $\theta_{Th}$ are intersection angles with the substrate 10 in cross section of the trench 30, and whether the angle is higher or not is determined based on the absolute value.

The threshold angle $\theta_{Th}$ is the highest propagation angle of threading dislocations that may be generated in the heterolayer 40, affecting the overlying layer or overlying structure 50 in cross section. The threshold angle $\theta_{Th}$ in cross section of the first direction (i.e., (a) direction of FIG. 1) is the highest propagation angle at which the first threading dislocations may be generated. The threshold angle $\theta_{Th}$ in cross section of the second direction (i.e., (b) direction of FIG. 1) is the highest propagation angle at which the second threading dislocations may be generated.

When the top point P1 or P2 of the corresponding sidewall 31 or 32 is configured such that at least one of cross-sectional diagonal lines of the trench 30 with undercut structure is higher than the corresponding threshold angle $\theta_{Th}$, the propagation of at least some of the first threading dislocations in the heterolayer 40 is quickly terminated by the non-vertical sidewall 31 or 32 in comparison with the vertical sidewall 31 or 32.

The threshold angle $\theta_{Th}$ relies on the lattice mismatch value between the second material of the heterolayer 40 and the first material of the substrate 10. It is because the extension angle of the threading dislocations that may be generated in the heterolayer 40 has a lattice mismatch-dependent tendency.

When the trench 30 with undercut structure is configured to have the cross-sectional diagonal line of the threshold angle $\theta_{Th}$ or more, the trench 30 may suppress all or nearly all of the threading dislocations that may be generated.

For example, when the substrate 10 is made of the first material selected from the first group and the heterolayer 40 is made of the second material selected from the second group, the extension angle of threading dislocations propagating from the cross section of the heterolayer 40 to the upper surface is a maximum of 60°, and in general, usually has angles in the range of 54° to 55°. Thus, the threshold angle $\theta_{Th}$ may be set to 60°. When the trench 30 with undercut structure is configured such that the cross-sectional diagonal line has the intersection angle of 60° or more and less than 90°, it is possible to suppress all or some of the first threading dislocations.

The density of dislocations affecting the overlying layer or overlying structure 50 reduced by the trench 30 with undercut structure may be quantified based on the area of the exposed upper surface of the heterolayer 40 in the trench 30.

In an embodiment, how much the dislocation density reduction performance of the trench 30 with undercut structure is improved compared to ART may be calculated through the following equation.

$$\text{Extent of improvement over ART} = \frac{(T-U)}{T}\times 100 \quad \text{[Equation 1]}$$

Here, T may be the area of the exposed upper surface of the heterolayer 40 in ART, and U may be the area of the exposed upper surface of the heterolayer 40 in the trench 30 with undercut structure. The extent of improvement over ART indicates the probability of further suppressing threading dislocations in comparison with ART.

The probability value may quantify the dislocation density reduction performance of the trench 30 with undercut structure.

In an embodiment, the trench 30 with undercut structure may be formed using a first mask pattern. Here, the first mask pattern has a sandglass-shaped cross section such that the central region in cross section has a narrower width than the top region and the bottom region. The process of forming the trench 30 using the first mask pattern will be described in more detail below with reference to FIG. 7.

In other embodiments, the trench 30 with undercut structure may be formed using a second mask pattern. Here, the second mask pattern has a triangular cross section such that the top region in cross section has a narrower width than the bottom region. The process of forming the trench 30 using the second mask pattern will be described in more detail below with reference to FIG. 10.

The semiconductor device 1 may include at least one trench 30 and at least one heterolayer 40 on the substrate 10. For example, the semiconductor device 1 may include at least one combination of the trench 30 and the heterolayer 40 of FIG. 1.

Figure 5:
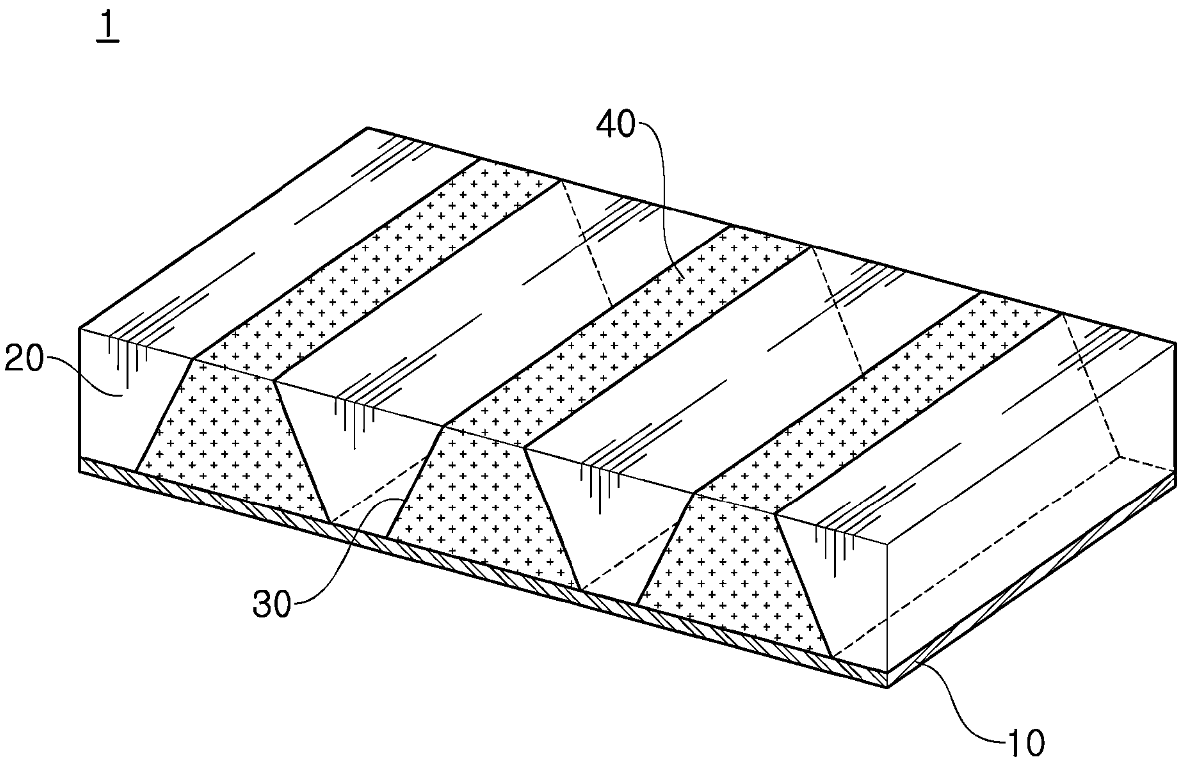
FIG. 5 is a plan view of a semiconductor device having a linear trench according to an embodiment of the present disclosure.

FIG. 5 is a plan view of the semiconductor device having the linear trench according to an embodiment of the present disclosure.

Referring to FIG. 5, the combination of the trench 30 and the heterolayer 40 may have a linear plane shape. The semiconductor device 1 includes the linear trench 30 and the linear heterolayer 40.

The trench 30 may be linearly extended on the substrate 10. Thus, the heterolayer 40 is also formed in a linearly extended plane shape.

The heterolayer 40 may be continuously formed along the linear trench 30 on the substrate 10. The linear trench 30 of FIG. 5 may reduce the density of the first threading dislocations and the density of the second threading dislocations in the heterolayer 40. In particular, the linear trench 30 of FIG. 5 suppresses the first threading dislocations.

The linear trench 30 may be formed using the first mask pattern or the second mask pattern of a line pattern.

Figure 6:
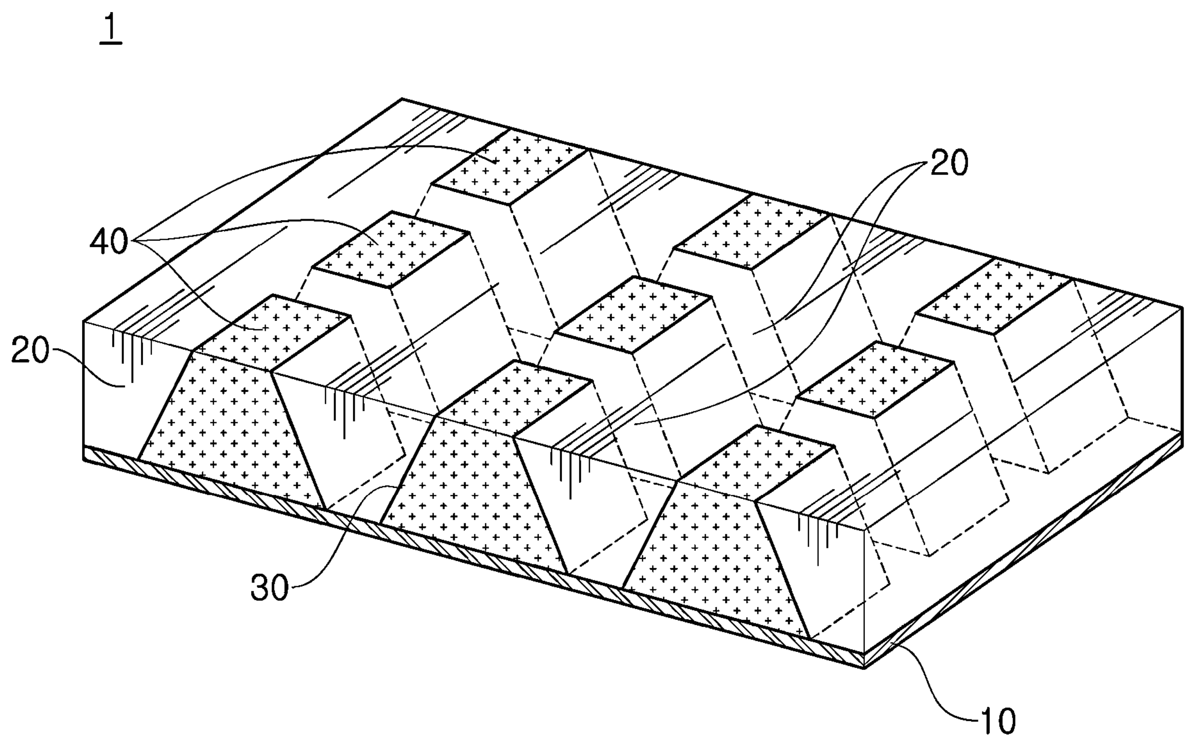
FIG. 6 is a plan view of a semiconductor device having an isolation trench according to an embodiment of the present disclosure.

FIG. 6 is a plan view of the semiconductor device having the isolation trench according to an embodiment of the present disclosure.

Referring to FIG. 6, the trench 30 may be formed in an island shape on a plane. The plurality of isolation trenches 30 arranged along the same array is arranged spaced apart from each other to avoid overlap in the area of each corresponding seed layer formed in each trench. The plurality of trenches 30 is arranged spaced apart from each other to avoid overlap between the area of the exposed upper surface of the seed layer 40 and the area of the lower surface surrounded by the insulation layer 20. Thus, the seed layer 40 is also formed in an island shape on a plane. The semiconductor device 1 includes the isolation trench 30 and the isolation seed layer 40.

The isolation trench 30 may be formed using the first mask pattern or the second mask pattern of an isolation pattern.

The plurality of isolation trenches 30 may be arranged side by side in a direction that is different from the cross-sectional direction of the undercut structure. For example, the plurality of isolation trenches 30 may be arranged in the (b) direction perpendicular to the (a) direction of FIG. 1 that is the cross-sectional direction of the undercut structure.

The seed layer 40 may be disposed in each isolation trench 30 on the substrate 10. The isolation trench 30 of FIG. 6 may reduce the density of the first threading dislocations and/or the density of the second threading dislocations in the seed layer 40.

In an embodiment, the semiconductor device 1 may include the isolation trench 30 configured to suppress the first threading dislocations and the second threading dislocations. In some embodiments, the isolation trench 30 configured to suppress the first threading dislocations and the second threading dislocations may be configured such that the diagonal line from the bottom point of one sidewall to the top point of the other sidewall in cross section taken along the (b) direction of FIG. 1 has an angle that is equal to or higher than the threshold angle $\theta_{Th}$, in order to suppress the second threading dislocations as well.

As described above, the isolation trench 30 may be configured such that the diagonal line from the bottom point (for example, P2) of one sidewall (for example, 31) to the top point (for example, P3) of the other sidewall (for example, 32) in cross section taken along the (a) direction of FIG. 1 has an angle that is equal to or higher than the threshold angle $\theta_{Th}$ to suppress the first threading dislocations.

When the isolation trench 30 is configured such that the diagonal line from the bottom point of one sidewall to the top point of the other sidewall in cross section taken along the (b) direction of FIG. 1 has an angle that is equal to or higher than the threshold angle $\theta_{Th}$ in order to suppress the second threading dislocations as well, it is possible to suppress all the second threading dislocations by the same principle as the threshold angle $\theta_{Th}$ for suppressing all the first threading dislocations.

Additionally, the semiconductor device 1 may include the plurality of trenches 30 with undercut structure of various plane array structures formed in the undercut structure of FIG. 2, and the plurality of heterolayers 40, each disposed in each trench 30.

To this end, the semiconductor device 1 may include the trenches 30 in arrays.

Referring back to FIGS. 5 and 6, the arrays of trenches 30 may include at least one of arrays of linear trenches 30, arrays of isolation trenches 30 or a combination thereof.

Since the semiconductor device 1 according to the embodiments of the present disclosure has the trench 30 with undercut structure such that the top line width is relatively narrow, it is possible to address the challenge in aspect ratio and reduce the density of dislocations in the seed layer 40.

The semiconductor device 1 may be manufactured using the first mask pattern or the second mask pattern including the cross-sectional shape that matches the cross-sectional shape of the undercut structure of the trench 30. As described above, the first mask pattern has the cross section in which the central region in cross section has a narrower width than the top region and the bottom region, and the second mask pattern has the cross section in which the top region in cross section has a narrower width than the bottom region.

Semiconductor Device Including Trench with Undercut Structure

The semiconductor device may have a wide range of 3D semiconductor device applications.

According to certain embodiments of the present disclosure, the semiconductor device 1 may be a semiconductor device with M3D structure. Referring back to FIG. 2, when the semiconductor device 1 is the M3D semiconductor device, the overlying layer 50 may be an overlying channel layer, and the heterolayer 40 may be a seed layer for forming the overlying channel layer 50.

Since the M3D semiconductor device 1 according to the present disclosure has the trench 30 with undercut structure, it is possible to relatively reduce the density of dislocations in the seed layer 40, thereby forming the overlying channel layer 50 with relatively high quality. In particular, it is possible to manufacture the trench 30 having a high aspect ratio under the relatively small thickness more easily, thereby forming the overlying channel layer 50 with higher quality more easily.

Figure 7:
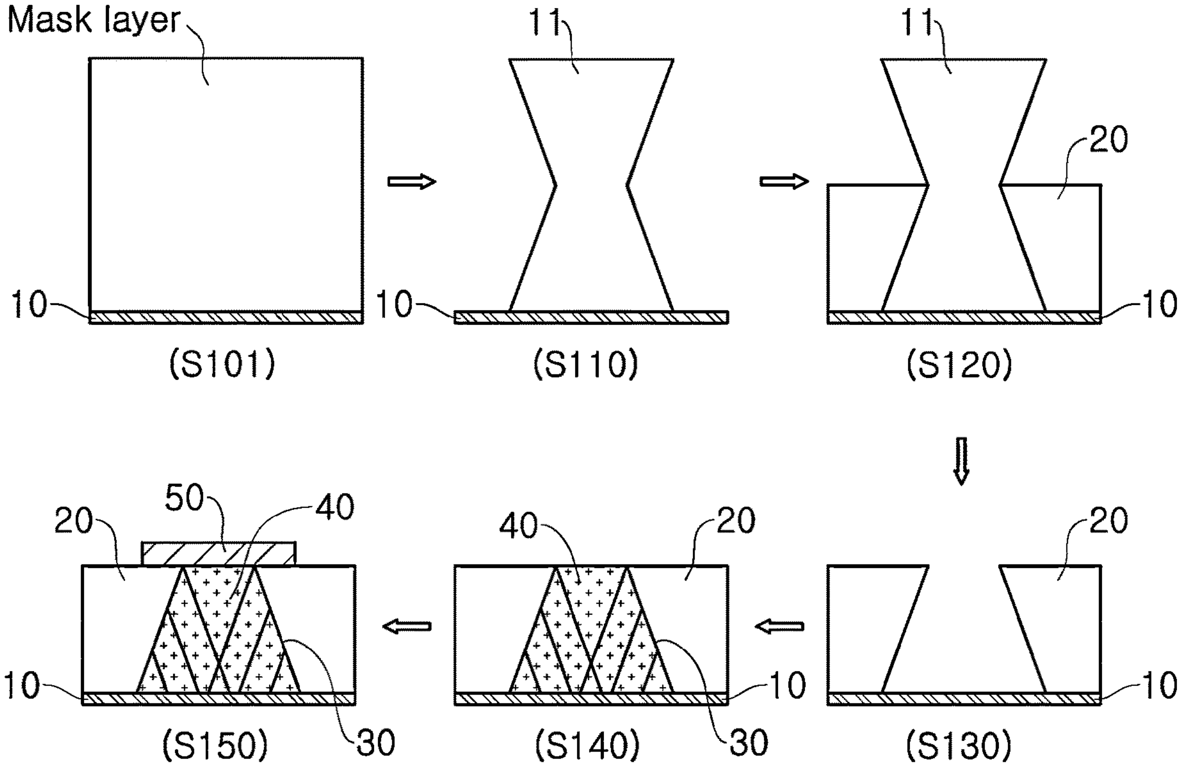
FIG. 7 is a schematic flowchart of a method for manufacturing a semiconductor device including a trench with undercut structure according to another aspect of the present disclosure.
Figure 10:
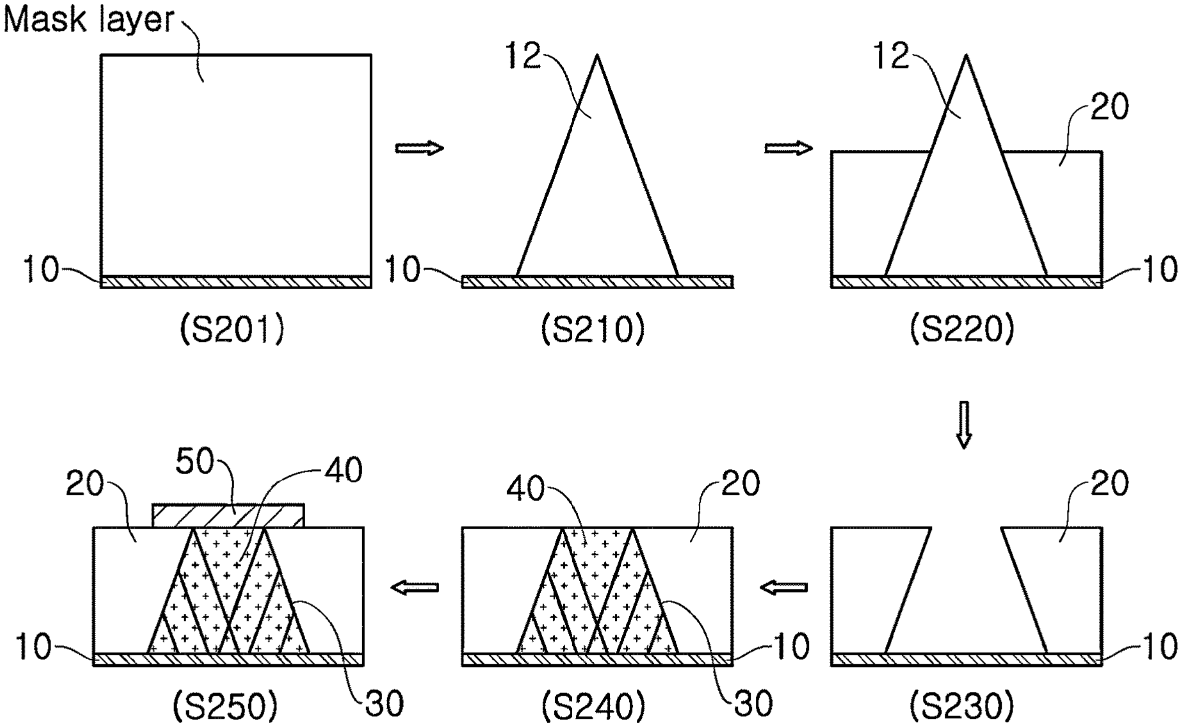
FIG. 10 is a schematic flowchart of a method for manufacturing a semiconductor device including a trench with undercut structure according to another aspect of the present disclosure.

Moreover, in the manufacture of the M3D semiconductor device 1 with undercut structure, there is no need for a buffer layer between the substrate 10 and the seed layer 40 commonly used to reduce the dislocation density. As shown in FIGS. 7 and 10, although the seed layer 40 is stacked immediately on the substrate 10, it is possible to form the overlying channel layer 50 with high quality.

As a result, it is possible to further reduce the complexity and cost of the process of manufacturing the M3D device 1.

According to other certain embodiments of the present disclosure, the semiconductor device 1 may be a semiconductor device with FINFET structure. Referring back to FIG. 2, when the semiconductor device 1 is the FINFET device, the overlying layer 50 may be a gate, and the heterolayer 40 may be a FIN body layer below the overlying gate to form a channel. It is possible to manufacture the FINFET device having the FIN body layer 40 with higher quality by making use of the undercut structure.

Additionally, the existing process techniques may be used to form the overlying channel layer 50 or stack the gate 50, thereby providing great versatile applications in fabricating memory and logic devices.

Method for Manufacturing Semiconductor Device Including Trench with Undercut Structure In certain embodiments, the method for manufacturing the semiconductor device according to another aspect of the present disclosure includes: forming a mask layer on the substrate 10; patterning the mask layer to form a mask pattern; forming the insulation layer 20 on the other exposed surface of the substrate having the mask pattern; removing the mask pattern from the structure of the mask pattern and the insulation layer 20 on the substrate to form the trench 30; and forming the heterolayer 40 in all or part of the internal space of the trench 30.

The manufacturing method will be described in more detail below with reference to FIGS. 7 and 10.

Figure 8:
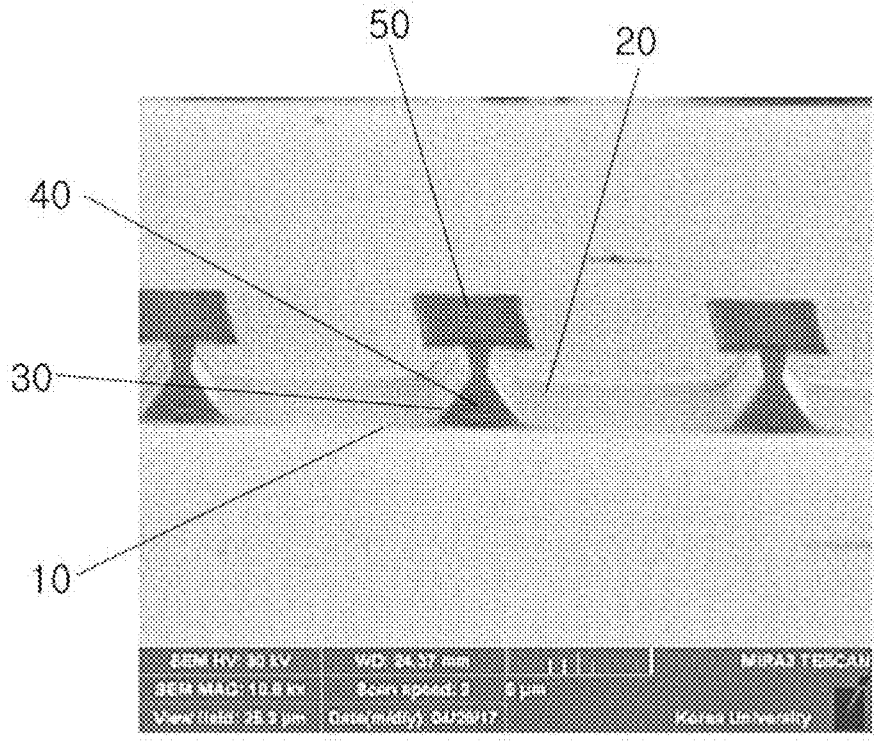
FIG. 8 is an image diagram of a semiconductor device 1 manufactured by the method for manufacturing a semiconductor device of FIG. 7.

FIG. 7 is a schematic flowchart of the method for manufacturing the semiconductor device including the trench 30 with undercut structure according to another aspect of the present disclosure, and FIG. 8 is an image diagram of the semiconductor device 1 manufactured by the method for manufacturing the semiconductor device 1 of FIG. 7.

Referring to FIG. 7, the method for manufacturing the semiconductor device 1 including the trench 30 with undercut structure includes: (S101) forming the mask layer on the substrate 10 made of the first material; (S110) patterning the mask layer to form the first mask pattern 11; (S120) forming the insulation layer 20 on the other exposed surface of the substrate 10 having the first mask pattern 11; (S130) removing the first mask pattern 11 from the structure of the first mask pattern 11 and the insulation layer 20 on the substrate 10 to form the trench 30 with the undercut structure; and (S140) forming the heterolayer 40 in the trench 30. Additionally, the manufacturing method may further include: (S150) forming the overlying layer or overlying structure 50 on the heterolayer 40.

In an embodiment, the mask layer or the first mask pattern 11 may be made of a third material that is different from the first material and the second material.

The third material is a material that can be etched by an etching solution that does not etch the insulation layer 20. The third material may include a crystalline material or a material that can form an oxide layer.

In an embodiment, the mask layer or the first mask pattern 11 may be made of a material selected from a third group consisting of Group IV, Group III-V and Group II-VI Semiconductor Materials, MgO and a Combination Thereof.

When the specific etching solution is used for the third material, only the mask layer is etched. The insulation layer 20 is not etched by the specific etching solution and is maintained.

In an embodiment, the step S110 of forming the first mask pattern 11 may include: patterning the mask layer to form a pattern so as to form a step on the surface of the mask layer; and etching at least one cross-sectional side of the pattern to form the first mask pattern such that the middle region is narrower than the top region and the bottom region in cross section of the pattern.

In the step S101, the mask layer is processed by various patterning processes of forming the step on the surface. For example, the mask layer may be patterned through a dry etching process. At least one pattern is formed in the mask layer by the patterning process.

In an embodiment, the step of forming the pattern may include at least one of forming the line pattern; or forming the plurality of isolation patterns arranged along a line.

When the step of forming the pattern only includes forming the line pattern, the line pattern such as a wire structure is formed. The line pattern is a pattern that is separated apart from each other in cross section of (a) direction of FIG. 1 and extended in the (b) direction of FIG. 1. The line pattern may be, for example, formed with the wire structure. Thus, it is possible to manufacture the semiconductor device 1 having the array of linear trenches 30 of FIG. 5.

When the step of forming the pattern only includes forming the plurality of isolation patterns, the isolation patterns such as an isolation array structure are formed. Thus, it is possible to manufacture the semiconductor device 1 having the array of isolation trenches 30 of FIG. 6.

When at least one side of each of the at least one pattern is etched in the step S110, the first mask pattern 11 is formed.

The first mask pattern 11 has a cross section configured such that the region having the narrowest width in the middle between top and bottom is narrower than the top width and the bottom width. The cross section of the first mask pattern 11 may be a cross section of a direction that matches the cross section of the undercut structure, i.e., the cross section of (a) direction of FIG. 1.

In an embodiment, the first mask pattern 11 may include a sandglass shaped-cross section such that the width of the region having the narrowest distance between the sides in cross section of the pattern is narrower than the top width and the bottom width. The sandglass shape may include a linear or non-linear cross-sectional side. That is, the first mask pattern 11 is not limited to the linear sandglass shape of FIG. 7.

The cross section of the first mask pattern 11 includes a cross-sectional region corresponding to the undercut structure of FIG. 2 as part of its area. That is, the entire cross-sectional area of each first mask pattern 11 includes an area corresponding to the undercut structure of FIG. 2 and the remaining area. For example, like the middle region of the sandglass, a point on a side and a point on an opposite side of the middle region may correspond to the top of the undercut structure.

To form the first mask pattern 11 in the step S110, the pattern formed on the substrate 10 may be processed through a wet etching process. For example, the mask layer may be patterned through a dry etching process to form the pattern, and then the wet etching process may be applied to the corresponding pattern.

In the step S120, the insulation layer 20 is formed through a variety of deposition processes.

In the step S120, the insulation layer 20 is formed on the first mask pattern 11 and the remaining exposed surface of the substrate 10 that is not covered with the first mask pattern 11. The thickness of the insulation layer 20 defines the depth of the trench 30.

In an embodiment, the insulation layer 20 may be formed with a greater thickness than the height at the location of the narrowest width between top and bottom in cross section of the first mask pattern. In this instance, the insulation layer 20 has a smaller thickness than the cross-sectional height of the first mask pattern 11.

Thus, the dislocation density reduction performance in the semiconductor device 1 is determined by the narrowest width in cross section of the first mask pattern and the height of two end points of the width. The height at the location of the narrowest width is the cross-sectional height from the substrate 10.

In another embodiment, the insulation layer 20 may be formed with a thickness that is equal to or less than the height at the location of the narrowest width between top and bottom in cross section of the first mask pattern. Thus, the dislocation density reduction performance in the semiconductor device 1 is determined by the top points (i.e., P1 and P3) of the sidewall 31 formed by the insulation layer 20 and the top points (i.e., P2 and P4) of the sidewall 32 formed by the insulation layer 20 and the cross-sectional width between the top points P1, P2 of the sidewalls 31, 32.

In an embodiment, the step S130 of removing the first mask pattern from the structure of the first mask pattern 11 and the insulation layer 20 on the substrate 10 to form the trench 30 with undercut structure may include: etching a part of the first mask pattern 11 on the surface of the insulation layer 20; and etching the other part of the first mask pattern 11 surrounded by the insulation layer 20.

When the first mask pattern 11 is removed, the trench 30 with undercut structure is formed (S130).

When the first mask pattern 11 is removed from the structure of the insulation layer 20 and the first mask pattern 11, the space occupied by the first mask pattern 11 is replaced with the aperture of which one end is closed by the substrate 10.

The aperture is used as the trench 30 with undercut structure.

The trench 30 with undercut structure has been described with reference to FIGS. 1 to 4 and its detailed description is omitted.

The heterolayer 40 is formed in the trench 30 by the epitaxy growth process (S140). The heterolayer 40 to be formed for the growth of the overlying layer is grown along the high crystallinity of the underlying layer (S140).

As shown in FIG. 8, in the step S150, the overlying layer or overlying structure 50 may be formed in contact with the area of the exposed upper surface of the heterolayer 40 formed in the trench 30.

In FIGS. 7 and 8, the cross-sectional width of the exposed upper surface of the heterolayer 40 may be determined based on the process time of the process of etching the side of the pattern in the step S110.

In an embodiment, the value of the narrowest width in cross section of the pattern may be determined based on the process time for etching the side of the pattern.

Figure 9:
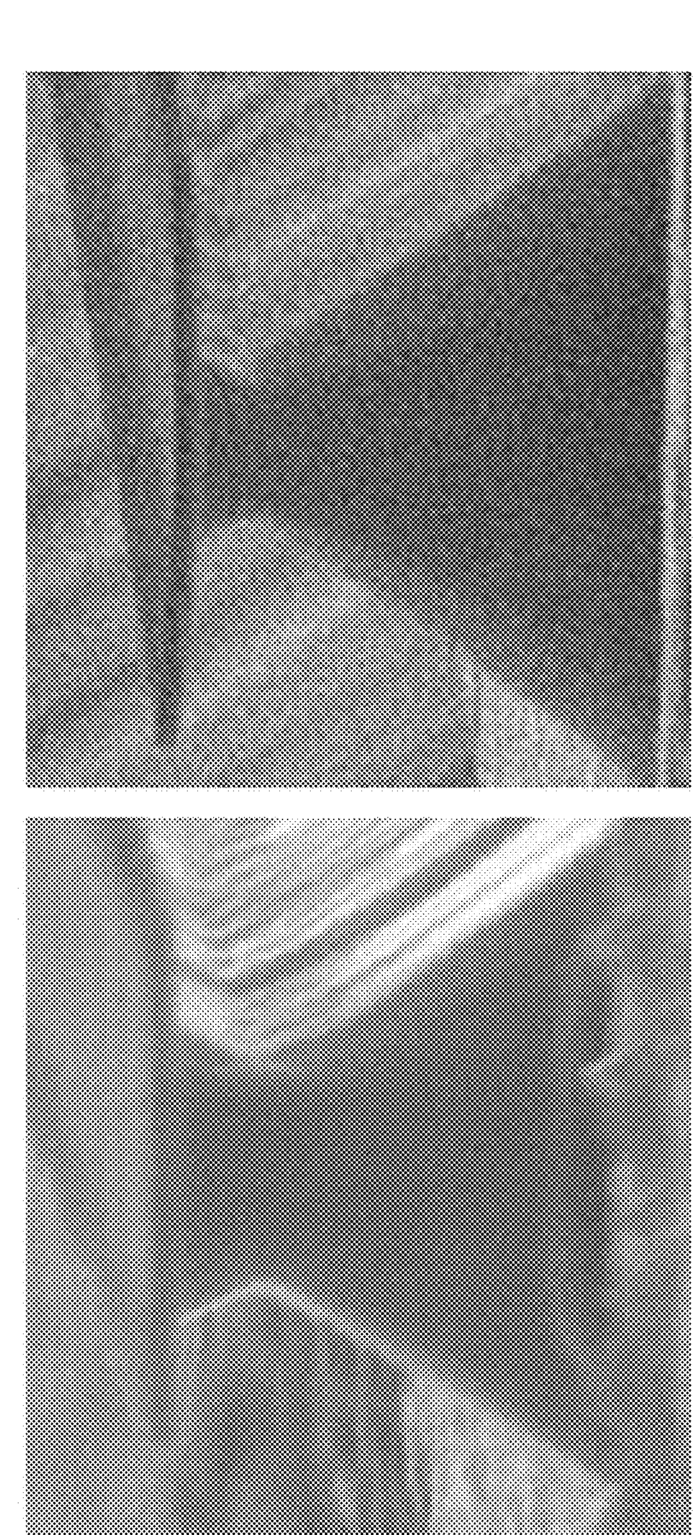
FIG. 9 is a diagram showing changes in narrowest cross-sectional width of a pattern with changes in process time of a process of etching the side of the pattern by wet etching according to an embodiment of the present disclosure.

FIG. 9 is a diagram showing changes in narrowest cross-sectional width of the pattern with changes in process time of the process of etching the side of the pattern by wet etching according to an embodiment of the present disclosure.

Referring to FIG. 9, as the wet etching process is applied longer, the value of the narrowest width in the pattern gradually decreases. When the pattern undergoes the wet etching process for a relatively short time, there may be an increase in the area of the exposed upper surface of the heterolayer 40 that will contact the overlying layer or overlying structure 50. In contrast, when the pattern undergoes the wet etching process for a relatively long time, there may be a decrease in the area of the exposed upper surface of the heterolayer 40 that will contact the overlying layer or overlying structure 50.

FIG. 10 is a schematic flowchart of the method for manufacturing the semiconductor device 1 including the trench 30 with undercut structure according to another aspect of the present disclosure.

The manufacturing method of FIG. 10 is similar to the manufacturing method of FIG. 7, and the following description is made based on difference(s).

Referring to FIG. 10, the method for manufacturing the semiconductor device 1 including the trench 30 with undercut structure includes: (S201) forming the mask layer on the substrate 10 made of the first material; (S210) patterning the mask layer to form the second mask pattern 12; (S220) forming the insulation layer 20 on the other exposed surface of the substrate 10 having the second mask pattern 12; (S230) removing the second mask pattern 12 from the structure of the second mask pattern 12 and the insulation layer 20 on the substrate 10 to form the trench 30 with the undercut structure; and (S240) forming the heterolayer 40 in the trench 30. Additionally, the manufacturing method may further include: (S250) forming the overlying layer or overlying structure 50 on the heterolayer 40.

The steps S201, S210, S20, S230, S240, S250 are similar to the steps S101, S110, S120, S130, S140, S150, and its detailed description is omitted.

The second mask pattern 12 has a cross section configured such that the cross-sectional top width is narrower than the cross-sectional bottom width. That is, the second mask pattern 12 has the cross-sectional top width having the narrowest cross-sectional width.

In an embodiment, the second mask pattern 12 may include a triangular cross section. The second mask pattern 12 may have a structure in which the cross-sectional top width has a value of 0 and is always smaller than the cross-sectional bottom width. In this case, the second mask pattern 12 has a 3D triangular pyramid structure. The cross-sectional triangle may include a linear or non-linear cross-sectional side. That is, the second mask pattern 12 is not limited to the linear triangle of FIG. 10.

The cross section of the second mask pattern 12 includes a cross-sectional region corresponding to the undercut structure of FIG. 2 as part of its area, but its occupied area is larger than the first mask pattern. For example, the cross-sectional region corresponding to the undercut structure of FIG. 2 to the cross section of the first mask pattern 11 may be 50%. In contrast, the cross-sectional region corresponding to the undercut structure of FIG. 2 to the cross section of the second mask pattern 12 may be larger than 50% (for example, 80% to 90%). That is, the entire cross-sectional area of the first mask pattern 21 may have the area that is substantially equal or similar to the undercut structure of FIG. 2.

In an embodiment, the second mask pattern 12 may be formed by etching at least one side of the pattern formed in the step S101.

When the second mask pattern 12 is used, forming the insulation layer 20 (S220) is similar to forming the insulation layer 20 with the thickness that is equal to or smaller than the height at the location of the narrowest width between top and bottom in cross section of the first mask pattern 11 among the above-described embodiments using the first mask pattern 11. As shown in FIG. 10, the insulation layer 20 is formed with the thickness that is smaller than the top point of the second mask pattern 12.

Subsequently, the exposed top region of the second mask pattern 12 on the surface of the insulation layer 20 is etched and the inside region surrounded by the insulation layer 20 is also etched.

Figure 11:
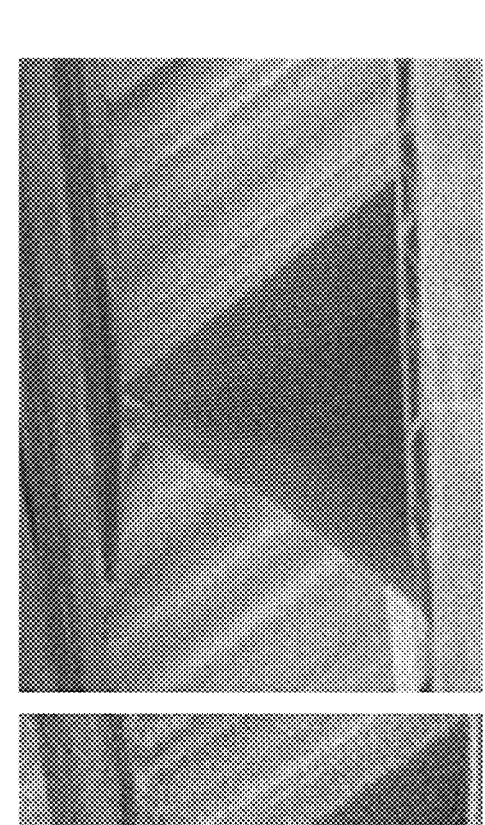
FIG. 11 is a diagram illustrating the process time of an etching process for forming a second mask pattern according to an embodiment of the present disclosure.
Figure 11:
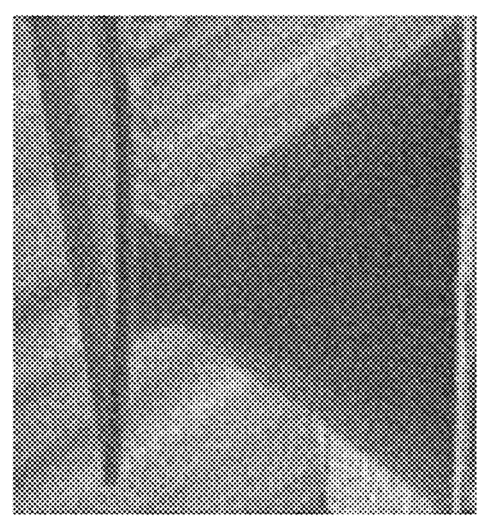
Figure 11:
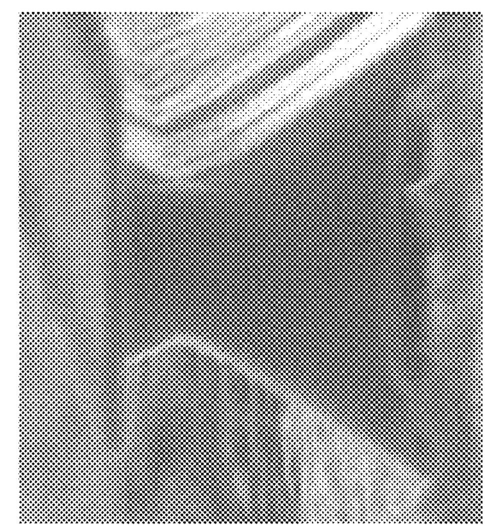

FIG. 11 is a diagram illustrating the process time of the etching process for forming the second mask pattern according to an embodiment of the present disclosure.

Referring to FIG. 11, the second mask pattern 12 may be formed by patterning the pattern formed in the step S101 for a relatively long time (S210). For example, as shown in FIG. 11, the second mask pattern 12 may be formed by etching the two sides of the pattern for a longer time than the process time for forming the first mask pattern 11.

The semiconductor device 1 including the trench 30 with undercut structure may reduce the density of dislocations that affect the overlying layer or overlying structure 50 at such a small thickness (i.e., a small depth of the trench 30) so that ART fails to sufficiently suppress dislocations that affect the overlying layer or overlying structure 50.

In particular, it is possible to achieve a high aspect ratio under the small thickness structure on the basis of the same width of the top region. The ART technique cannot achieve a high aspect ratio under the small thickness structure on the basis of the same width of the top region.

Specifically, the ART technique forms the trench 30 by directly etching a predetermined part of the insulation layer 20. The process of forming the trench 30 using the etching process is relatively difficult to manufacture the high aspect ratio trench 30 with a small thickness of a few tens of nm or less than 200 nm. In general, due to the limitations of the etching process, the semiconductor device to which the ART technique is applied includes the insulation layer having the minimum thickness of 300 nm or more. Additionally, in general, the trench formed in the insulation layer having the above-described thickness has the minimum width of about 200 nm.

However, according to the embodiments of the present disclosure, it is possible to reduce the internal space of the trench 30 more easily by adjusting the thickness of the insulation layer 20 and the width of the mask pattern 11, thereby minimizing the size of the seed layer 40 more easily. For example, the semiconductor device 1 having the trench 30 with undercut structure may include the insulation layer 20 having the thickness of 80 nm to 120 nm or 90 nm to 110 nm (for example, about 100 nm). At the same time, the trench 30 with undercut structure may have the bottom width of 50 nm to 70 nm or 55 nm to 65 nm (for example, about 60 nm). Thus, the semiconductor device 1 having the trench 30 with undercut structure may include the heterolayer 40 having the width that is equal to or smaller than the value of the bottom width of the trench 30.

Since the semiconductor device 1 having the trench 30 with undercut structure may include the trench 30 having a relatively small thickness and a high aspect ratio, it is possible to significantly reduce the density of dislocations in the heterolayer 40.

The undercut structure of the present disclosure is clearly distinguished from the cross section as the result of the undercut phenomenon that may occur in the etching process. As described above, the undercut structure of the present disclosure is a cross-sectional structure that is intentionally formed to have the value of ART for reducing the density of dislocations in the heterolayer. In contrast, the result of the undercut phenomenon that may occur in the etching process is nothing but an unintended result with sidewalls having a slope simply by the dry etching process.

While the present disclosure has been hereinabove described with reference to the embodiments shown in the drawings, this is provided by way of illustration and it will be appreciated by those having ordinary skill in the art that various modifications and variations may be made thereto.

However, it should be noted that such modifications fall in the technical protection scope of the present disclosure. Therefore, the true technical protection scope of the present disclosure should be defined by the technical spirit of the appended claims.

DETAILED DESCRIPTION OF MAIN ELEMENTS

1: Semiconductor device
10: Substrate
20: Insulation layer
30: Trench
31, 32: Sidewall
40: Heterolayer

What is claimed is:

1. A semiconductor device, comprising:

a substrate made of a first material;

an insulation layer formed on an upper surface of the substrate, the insulation layer made of an insulating material;

at least one trench penetrating the insulation layer toward the substrate; and at least one layer made of a second material, which is different from the first material, creates a heterojunction with the first material and formed in at least part of an internal space of the trench, wherein the insulation layer is configured to form the trench with undercut structure in which a width of a top or a narrowest width between the top and a bottom is narrower than a width of the bottom in cross section of the trench, wherein the second material has a lattice mismatch with respect to the first material, and the at least one layer includes first and second threading dislocations extending, at least in part, in a first direction and a second direction, respectively, non-parallel to the upper surface of the substrate and parallel to a <110> direction of a (111) surface, and propagation of at least some of the first and second threading dislocations is terminated by sidewalls which surround an inside of the trench, wherein the sidewalls of the trench with undercut structure are configured such that an area of an upper surface of the at least one layer is smaller than that of vertical sidewalls, wherein the trench with undercut structure is configured such that an imaginary diagonal line from a bottom point on a side to a top point on an opposite side in cross section of the trench has an angle which is equal to or higher than a threshold angle, and wherein the threshold angle is an intersection angle indicating a highest propagation angle among propagation angles of threading dislocations which may be generated in the at least one layer from a surface of the substrate in cross section of the trench, and is based on a value of the lattice mismatch between the second material and the first material.

2. The semiconductor device according to claim 1, wherein the trench with undercut structure is configured such that an imaginary diagonal line from a bottom point on a side to a top point on an opposite side in cross section of the trench has an intersection angle of 60° or more and less than 90°.

3. The semiconductor device according to claim 1, wherein the trench with undercut structure is configured such that at least one of the two sidewalls in cross section is non-vertical, and the at least one sidewall includes a linear or non-linear cross-sectional sidewall.

4. The semiconductor device according to claim 1, wherein when the substrate is made of a material selected from a first group, the at least one layer is made of a material selected from a second group, wherein when the substrate is made of a material selected from the second group, the at least one layer is made of a material selected from the first group, wherein the first group includes Si, Group IV material other than Si and a combination thereof, and wherein the second group includes at least one of SixGe1−x, Ge, Group III-V, Group II-VI, a material which can be grown by heterogeneous junction or a combination thereof.

5. The semiconductor device according to claim 1, wherein the trench with undercut structure is extended from a side of the substrate to an opposite side and the at least one layer in the trench is continuously formed.

6. The semiconductor device according to claim 1, wherein the semiconductor device comprises a plurality of the trenches and a plurality of the at least one layer, each of the at least one layer formed in each trench, wherein the plurality of trenches is arranged side by side in a direction, wherein the plurality of trenches is arranged spaced apart from each other to avoid overlap in an area of each of the at least one layers formed in each trench.

7. The semiconductor device according to claim 1, wherein the semiconductor device is a semiconductor device with Monolithic 3-Dimensional (M3D) structure, and wherein the at least one layer is a seed layer for growing an overlying channel layer.

8. The semiconductor device according to claim 1, wherein the semiconductor device is a semiconductor device with FINFET structure, and wherein the at least one layer is a FIN body layer disposed below an overlying gate to form a channel.

9. A semiconductor device, comprising:

a substrate made of a first material;

an insulation layer formed on an upper surface of the substrate, the insulation layer made of an insulating material;

at least one trench penetrating the insulation layer toward the substrate; and at least one layer made of a second material, which is different from the first material, creates a heterojunction with the first material and formed in at least part of an internal space of the trench, wherein the insulation layer is configured to form the trench with undercut structure in which a width of a top or a narrowest width between the top and a bottom is narrower than a width of the bottom in cross section of the trench, wherein the second material has a lattice mismatch with respect to the first material, and the at least one layer includes first and second threading dislocations extending, at least in part, in a first direction and a second direction, respectively, non-parallel to the upper surface of the substrate and parallel to a <110> direction of a (111) surface, and propagation of at least some of the first and second threading dislocations is terminated by sidewalls which surround an inside of the trench, wherein the sidewalls of the trench with undercut structure are configured such that an area of an upper surface of the at least one layer is smaller than that of vertical sidewalls, wherein the trench with undercut structure is configured such that an imaginary diagonal line from a bottom point on a side to a top point on an opposite side in cross section of the trench has an intersection angle of 60° or more and less than 90°.

10. The semiconductor device according to claim 9, wherein the trench with undercut structure is configured such that an imaginary diagonal line from a bottom point on a side to a top point on an opposite side in cross section of the trench has an angle which is equal to or higher than a threshold angle, and wherein the threshold angle is an intersection angle indicating a highest propagation angle among propagation angles of threading dislocations which may be generated in the heterolayer from a surface of the substrate in cross section of the trench, and is based on a value of the lattice mismatch between the second material and the first material.

11. The semiconductor device according to claim 9, wherein the trench with undercut structure is configured such that at least one of the two sidewalls in cross section is non-vertical, and the at least one sidewall includes a linear or non-linear cross-sectional sidewall.

12. The semiconductor device according to claim 9, wherein when the substrate is made of a material selected from a first group, the at least one layer is made of a material selected from a second group, wherein when the substrate is made of a material selected from the second group, the at least one layer is made of a material selected from the first group, wherein the first group includes Si, Group IV material other than Si and a combination thereof, and wherein the second group includes at least one of SixGe1−x, Ge, Group III-V, Group II-VI, a material which can be grown by heterogeneous junction or a combination thereof.

13. The semiconductor device according to claim 9, wherein the trench with undercut structure is extended from a side of the substrate to an opposite side and the at least one layer in the trench is continuously formed.

14. The semiconductor device according to claim 9, wherein the semiconductor device comprises a plurality of the trenches and a plurality of the at least one layer, each of the at least one layer formed in each trench, wherein the plurality of trenches is arranged side by side in a direction, wherein the plurality of trenches is arranged spaced apart from each other to avoid overlap in an area of each of the at least one layers formed in each trench.

15. The semiconductor device according to claim 9, wherein the semiconductor device is a semiconductor device with Monolithic 3-Dimensional (M3D) structure, and wherein the at least one layer is a seed layer for growing an overlying channel layer.

16. The semiconductor device according to claim 9, wherein the semiconductor device is a semiconductor device with FINFET structure, and wherein the at least one layer is a FIN body layer disposed below an overlying gate to form a channel.

* * * * *